(12) United States Patent
Ohta (10) Patent No.: US 11,183,595 B2
(45) Date of Patent: Nov. 23, 2021

(54) THIN FILM TRANSISTOR, IMAGE DISPLAY PANEL, AND METHOD FOR MANUFACTURING THIN FILM TRANSISTOR

(71) Applicant: SAKAI DISPLAY PRODUCTS CORPORATION, Sakai (JP)

(72) Inventor: Hiroyuki Ohta, Sakai (JP)

(73) Assignee: SAKAI DISPLAY PRODUCTS CORPORATION, Sakai (JP)

(*) Notice: Subject to any disclaimer, the term of this patent is extended or adjusted under 35 U.S.C. 154(b) by 0 days.

(21) Appl. No.: 17/070,638

(22) Filed: Oct. 14, 2020

(65) Prior Publication Data

US 2021/0159344 A1 May 27, 2021

Related U.S. Application Data

(60) Provisional application No. 62/939,038, filed on Nov. 22, 2019.

(51) Int. Cl.
| | | |
|---|---|---|
| *H01L 29/786* | (2006.01) | |
| *H01L 27/12* | (2006.01) | |
| *H01L 29/66* | (2006.01) | |
| *H01L 29/10* | (2006.01) | |
| *H01L 29/49* | (2006.01) | |

(52) U.S. Cl.
CPC .... *H01L 29/78669* (2013.01); *H01L 27/1222* (2013.01); *H01L 29/1041* (2013.01); *H01L 29/4908* (2013.01); *H01L 29/66765* (2013.01)

(58) Field of Classification Search
CPC .......... H01L 29/78669; H01L 27/1222; H01L 29/66765; H01L 29/1041; H01L 29/4908; H01L 29/78696
See application file for complete search history.

(56) References Cited

U.S. PATENT DOCUMENTS

2017/0170276 A1* 6/2017 Marino .................. H01L 29/78
2020/0091274 A1* 3/2020 Sharma ............. H01L 29/66742

* cited by examiner

*Primary Examiner* — Mohammed R Alam
(74) *Attorney, Agent, or Firm* — ScienBiziP, P.C.

(57) ABSTRACT

A thin film transistor according to one embodiment comprises a gate electrode; a semiconductor layer being formed using amorphous silicon and comprising a region overlapping with the gate electrode; a gate insulating layer; and a source electrode and a drain electrode facing each other with a predetermined interval therebetween. The gate electrode comprises a first layer having a first work function; and a second layer having a second work function and being interposed between the first layer and the gate insulating layer. The semiconductor layer comprises an intrinsic region being formed with non-doped amorphous silicon; and a low concentration impurities region. The second work function is less than the first work function when n-type impurities are contained in the low concentration impurities region, while the second work function is greater than the first work function when p-type impurities are contained in the low concentration impurities region.

10 Claims, 7 Drawing Sheets

THIN FILM TRANSISTOR, IMAGE DISPLAY PANEL, AND METHOD FOR MANUFACTURING THIN FILM TRANSISTOR

CROSS-REFERENCE TO RELATED APPLICATIONS

This application claims priority to and the benefit of priority of U.S. Provisional Application No. 62/939,038, filed on Nov. 22, 2019 the entire contents of which are incorporated herein by reference.

BACKGROUND

Technical Field

The disclosure relates to a thin film transistor, an image display panel, and a manufacturing method for the thin film transistor.

Description of Related Art

Thin film transistors (TFT) are used as a pixel drive element in a display panel to be embedded in flat panel display apparatuses such as a liquid crystal display apparatus and an organic-EL display apparatus. The TFTs generally comprise a gate electrode, a gate insulating layer, a source electrode and a drain electrode, and a semiconductor layer comprising a channel portion to be a conductive channel between the source electrode and the drain electrode. Of such TFTs, the TFT comprising the semiconductor layer being formed with amorphous silicon is extensively used, particularly in a liquid crystal display panel, to take advantage of the features such as low cost and low off-current.

In the field of flat panel display apparatuses such as the liquid crystal display apparatuses, as the release of a so-called 8K liquid crystal display apparatus, or, in other words, a liquid crystal display apparatus having 33 megapixels has started, enhancement in resolution has been promoted continuously. To realize an increase in the number of pixels in this way, making each pixel finer is called for. However, merely decreasing the area of an individual pixel could cause the display performance of each pixel to degrade with a decrease in aperture ratio. Therefore, for the progress in enhancement in resolution, downsizing of the TFT to drive each pixel, and/or fining a bus wiring to supply power or various signals to each TFT is called for.

SUMMARY

As one measure to downsize a TFT, it is considered to shorten the channel length being an interval between a source electrode and a drain electrode. Shortening of the channel length not only results in downsizing of the TFT, but also causes thinning of a gate bus wiring being arranged on a display panel through shortening of the gate length (the width of a gate electrode along a direction in which the source electrode and the drain electrode face each other) being in correlation with the channel length. Describing in detail, the gate electrode is coupled to the gate bus wiring being connected to a gate driver and integrally formed with the gate bus wiring by forming of a mask by exposure and patterning such as etching using the mask. Therefore, making only the gate bus wiring finer could make it difficult to accurately pattern both the gate bus wiring and the gate electrode from the aspect of condition setting of exposure or etching. On the other hand, shortening the width of the gate electrode makes it possible to thin the gate bus wiring without having a problem of patterning accuracy. Therefore, shortening of the channel length can cause not merely downsizing of the TFT, but also thinning of the gate bus wiring through shortening of the gate length, causing, in turn, the aperture ratio of each pixel to be maintained or improved.

However, shortening of the channel length could cause a decrease in the gate threshold due to a so-called short channel effect, and, as a result, making it not possible to obtain desired switching characteristics. Then, according to one embodiment of the disclosure, a novel thin film transistor is provided to realize downsizing of a TFT and, in turn, maintaining or improving of the aperture ratio of a pixel of an image display panel without remarkably degrading the performance required for the TFT.

A thin film transistor according to one embodiment of the present disclosure comprises: a gate electrode; a semiconductor layer being formed using amorphous silicon and comprising a first region overlapping with the gate electrode in planar view; a gate insulating layer being interposed between the gate electrode and the semiconductor layer; and a source electrode and a drain electrode being arranged so as to face each other and have a predetermined interval above the first region between the source electrode and the drain electrode. The gate electrode comprises a first layer having a first work function and a second layer having a second work function, the second layer being interposed between the first layer and the gate insulating layer; the semiconductor layer comprises an intrinsic region being formed with non-doped amorphous silicon; and a low concentration impurities region containing impurities in a predetermined low concentration and being formed in separation from the gate insulating layer; and the second work function is less than the first work function in a case that the impurities are n-type impurities, while the second work function is greater than the first work function in a case that the impurities are p-type impurities.

According to another embodiment of the present disclosure, an image display panel is provided. The image display panel according to another embodiment of the present disclosure comprises a plurality of the thin film transistors, according to the one embodiment of the present disclosure, being formed in a matrix on a substrate; and a plurality of pixels being provided in a matrix on the substrate to be driven using the thin film transistors.

According to yet another embodiment of the present disclosure, a manufacturing method for a thin film transistor is provided. The manufacturing method for the thin film transistor according to yet another embodiment of the present disclosure comprises: forming a gate electrode on a substrate; forming a gate insulating layer to cover the gate electrode; forming, on the gate insulating layer, a semiconductor layer being a layer formed with amorphous silicon and comprising a first region overlapping with the gate electrode in planar view; forming a source electrode and a drain electrode, by forming and patterning a conductor layer, so as to face each other and have a predetermined interval above the first region between the source electrode and the drain electrode; and providing a low concentration impurities region containing impurities in a predetermined low concentration at a predetermined region of the semiconductor layer by adding the impurities to the predetermined region, the predetermined region being separated from the gate insulating layer. Forming the gate electrode comprises: forming a first layer using a material having a first work function; and forming a second layer being interposed between the first layer and the gate insulating layer using a material having a second work function, and the second work function is less than the first work function in a case that the impurities are n-type impurities, while the second work function is greater than the first work function in a case that the impurities are p-type impurities.

A thin film transistor and a manufacturing method for the thin film transistor according to each of the above-described embodiments make it possible to realize downsizing of a TFT and, moreover, making a wiring being connected to the TFT thinner without causing variations in the specific characteristics of the thin film transistor. Then, an image display panel according to the above-described embodiment makes it possible to improve the aperture ratio of each pixel and increase the number of pixels without accompanying degradation in display performance.

DETAILED DESCRIPTION

Below, a thin film transistor, an image display panel, and a manufacturing method for the thin film transistor according to embodiments of the disclosure are described with reference to the drawings. The thin film transistor, the image display panel, and the manufacturing method for the thin film transistor according to the disclosure is construed to be not limited to what are described in the embodiments below and each of the drawings referred to.

[Configuration of Thin Film Transistor]

Figure 1:
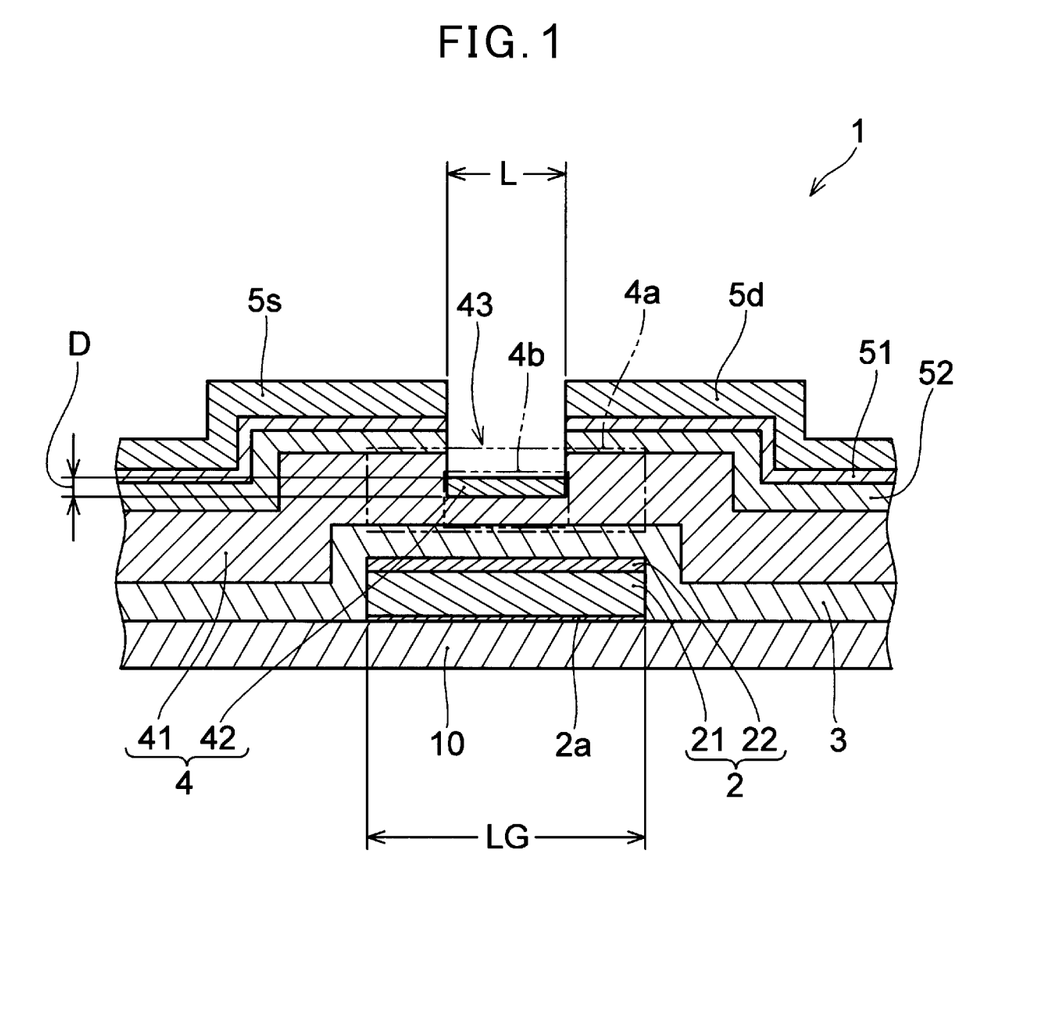
FIG. 1 shows a cross-sectional view of one example of a thin film transistor according to one embodiment of the disclosure.

FIG. 1 shows a cross-sectional view of one example of a thin film transistor (TFT) 1 according to one embodiment of the disclosure. As shown in FIG. 1, the TFT 1 comprises a gate electrode 2 being formed on a substrate 10; a gate insulating layer 3 to cover the gate electrode 2 therewith; a semiconductor layer 4; and a source electrode 5s and a drain electrode 5d. The semiconductor layer 4 comprises a first region 4a overlapping with the gate electrode 2 in planar view. The gate insulating layer 3 is interposed between the gate electrode 2 and the semiconductor layer 4. The source electrode 5s and the drain electrode 5d are arranged so as to face each other and have a predetermined interval L therebetween above the first region 4a (in a direction being opposite to the gate electrode 2 with respect to the semiconductor layer 4). In the TFT 1 being exemplified in FIG. 1, an impurities containing layer 52 and a contact layer 51 each formed with amorphous silicon containing impurities are formed between each of the source electrode 5s and the drain electrode 5d, and the semiconductor layer 4. The "planar view" means viewing the TFT 1 on a line of sight being parallel with a lamination direction from the gate electrode 2 to the source electrode 5s and the drain electrode 5d (a direction being perpendicular to a surface of the substrate 10 on which the gate electrode 2 is formed).

The thin film transistor according to the embodiment can be a field effect transistor of which carrier type is either n-type or p-type. In other words, impurities to be added to an impurities containing region in the semiconductor layer 4 (for example, a below-described low concentration impurities region 42) and the impurities containing layer 52 can be either one of n-type impurities and p-type impurities. While a pentavalent element (n-type impurities) such as phosphorus or arsenic and a trivalent element (p-type impurities) such as boron or indium can be exemplified as the impurities to be added to the semiconductor layer 4 being formed with amorphous silicon, the impurities to be added to the semiconductor layer 4 and the impurities containing layer 52 are construed to be not limited thereto. In the explanations below, unless indicated otherwise, the TFT according to the embodiment is explained with a case in which the TFT 1 is an n-type field effect transistor as an example. Therefore, as with the impurities containing layer 52, a layer or a region being formed with a semiconductor containing impurities is also called an "n– layer" or an "n– region", or an "n+ layer" or an "n+ region" in accordance with the concentration of the impurities thereof.

The source electrode 5s and the drain electrode 5d are each formed using a metal having an appropriate conductivity, such as copper or aluminum, and face each other with an interval L therebetween. The semiconductor layer 4 comprises a second region 4b being sandwiched between the source electrode 5s and the drain electrode 5d in planar view. A channel of the TFT 1 is formed in the second region 4b in accordance with the electric potential of the gate electrode 2. The second region 4b has a length L as a length (a channel length) in a direction in which the source electrode 5s and the drain electrode 5d face each other. Moreover, the gate electrode 2 has a length LG (a gate length LG) in a direction in which the source electrode 5s and the drain electrode 5d face each other.

The gate insulating layer 3 is formed using silicon oxide, silicon nitride, or silicon oxynitride, and insulates the gate electrode 2 from a non-insulating material such as the semiconductor layer 4.

The contact layer 51 is provided to obtain an ohmic contact between each of the source electrode 5s and the drain electrode 5d, and the semiconductor layer 4 (the n+ layer 52 being formed on the semiconductor layer 4 in the example in FIG. 1). The contact layer 51 is formed by doping impurities such as the previously-described phosphorus or boron to a semiconductor such as silicon so as to have a high impurities concentration (for example, greater than or equal to $1E+20$ $(/cm^3)$), for example.

Moreover, the n+ layer 52 is also formed by doping impurities such as phosphorus to a semiconductor such as silicon. In a case that the TFT 1 is a p-type field effect transistor, an impurities containing layer containing the p-type impurities (a p+ layer) can be formed between the semiconductor layer 4 and the contact layer 51. The impurities concentration of the n+ layer 52 is approximately greater than or equal to $1E+17$ $(/cm^3)$ and less than or equal to $1E+19$ $(/cm^3)$, for example, which is less than the impurities concentration of the contact layer 51. Providing the n+ layer 52 causes a depletion layer to be formed between the semiconductor layer 4 and the n+ layer 52, making it possible to decrease current of the TFT 1 when it is off.

The semiconductor layer 4 is formed using amorphous silicon. Then, in the TFT 1, the semiconductor layer 4 comprises an intrinsic region 41 being formed with non-doped amorphous silicon and a low concentration impurities region (an n− region) 42 containing impurities in a predetermined low concentration. The "low concentration" of the low concentration impurities region 42 represents an impurities concentration in which the low concentration impurities region 42 when no voltage is applied to the gate electrode 2 indicates the sheet resistance being greater than or equal to 20 kΩ/square. As the impurities concentration of the low concentration impurities region 42, a concentration being greater than or equal to $5E+16$ $(/cm^3)$ and less than or equal to $5E+18$ $(/cm^3)$ can be exemplified. In this way, the impurities concentration of the low concentration impurities region 42 is less than the impurities concentration of the impurities containing layer 52.

The low concentration impurities region 42 is formed in the semiconductor layer 4 in separation from the gate insulating layer 3, or, in other words, at an interval from the gate insulating layer 3. Therefore, compared to a case that the impurities are added such that the impurities reach the gate insulating layer 3, scattering due to the impurities is more unlikely to occur. Moreover, a small S factor can be obtained, making it possible to obtain good switching characteristics.

In the TFT 1 in the example in FIG. 1, the low concentration impurities region 42 is formed up to a predetermined depth D from a surface of the semiconductor layer 4, the surface being opposite to the gate insulating layer 3. The predetermined depth D is greater than or equal to 10 nm and less than or equal to 40 nm, for example.

On the semiconductor layer 4 of the TFT 1 exemplified in FIG. 1, a recess 43 is provided by removing a surface portion between the source electrode 5s and the drain electrode 5d. Then, the n− region 42 is formed up to a predetermined depth D toward the gate insulating layer 3 from the bottom surface of the recess 43. In other words, the n-region 42 is included in the second region 4b of the semiconductor layer 4, the second region 4b being sandwiched between the source electrode 5s and the drain electrode 5d in planar view.

As described previously, a channel of the TFT 1 is formed in the second region 4b. The n− region 42 is included in the second region 4b, so that the off current is unlikely to increase.

Moreover, in the TFT 1 according to the embodiment, the gate electrode 2 has the laminated structure comprising a first layer 21 and a second layer 22, work functions of which are mutually different. The first layer 21 is formed using a material having a first work function, while the second layer 22 is formed using a material having a second work function. The second layer 22 is interposed between the first layer 21 and the gate insulating layer 3. The gate electrode 2 being exemplified in FIG. 1 is formed on a barrier metal 2a to be formed using titanium, for example. However, the barrier metal 2a is not necessarily provided.

The material having the second work function, which material is to be used for the second layer 22, is selected in accordance with the carrier type of the TFT 1, or, in other words, in accordance with the type of impurities contained in the semiconductor layer 4. In a case that the impurities contained in the low concentration impurities region 42 of the semiconductor layer 4 are the n-type impurities, the work function (the second work function) of the material to form the second layer 22 is less than the first work function. On the other hand, in a case that the impurities contained in the low concentration impurities region 42 are the p-type impurities, the second work function is greater than the first work function. As the material to be used for the first layer 21, copper (WF: approximately 5.0 eV), aluminum (WF: approximately 4.2 eV), titanium (WF: approximately 4.3 eV), and molybdenum (WF: approximately 4.2 eV) can be exemplified. As the material to be used for the second layer 22 in a case that the TFT 1 is a n-type field effect transistor, each lanthanoid including lanthanum (WF: approximately 3.5 eV), magnesium (WF: approximately 3.4 eV), and a compound thereof can be exemplified. As the material to be used for the second layer 22 in a case that the TFT 1 is a p-type field effect transistor, platinum (WF: approximately 5.64 eV to 5.93 eV), and a compound of selenium (WF: approximately 5.9 eV) and a metal (for example, zinc selenide) can be exemplified. Each of the materials described above being exemplified as a material of the first layer 21 or the second layer 22 can be combined arbitrarily. For example, the first layer 21 can be formed using copper and the second layer 22 can contain lanthanum.

In the TFT 1 according to the embodiment, compared to the conventional TFT not comprising the second layer 22 of the gate electrode 2 and the n− region 42, variations in the characteristics associated with shortening of the channel length L can be suppressed or prevented. The reason for the above is to be described below:

[Function of TFT According to Embodiment]

Figure 2A:
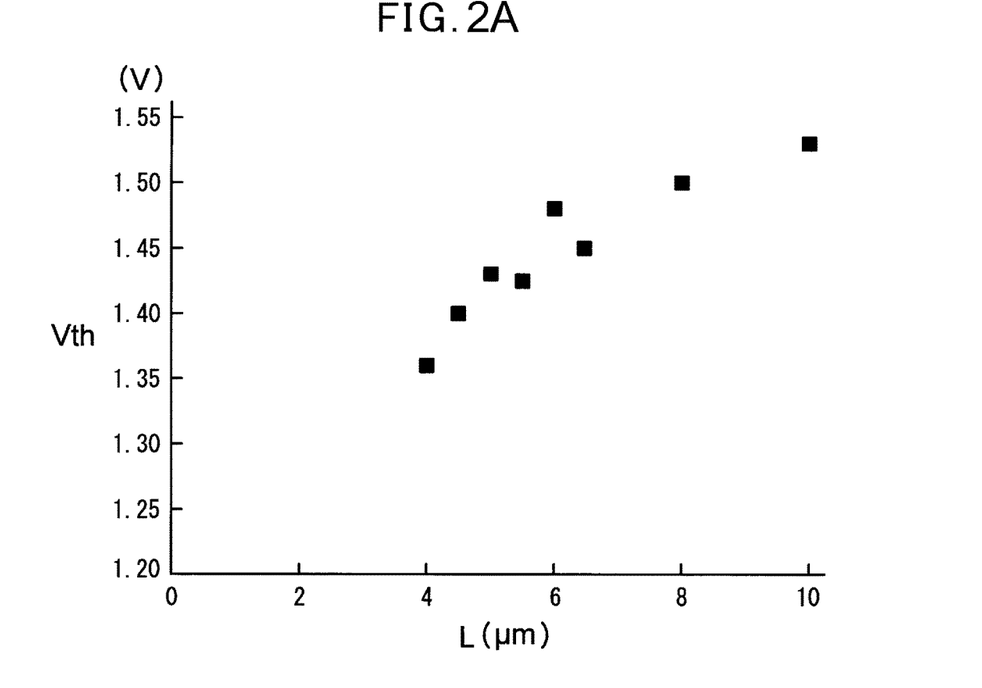
FIG. 2A shows a characteristic diagram of one example of the relationship between a channel length (L) of the thin film transistor and a gate threshold (Vth).
Figure 2B:
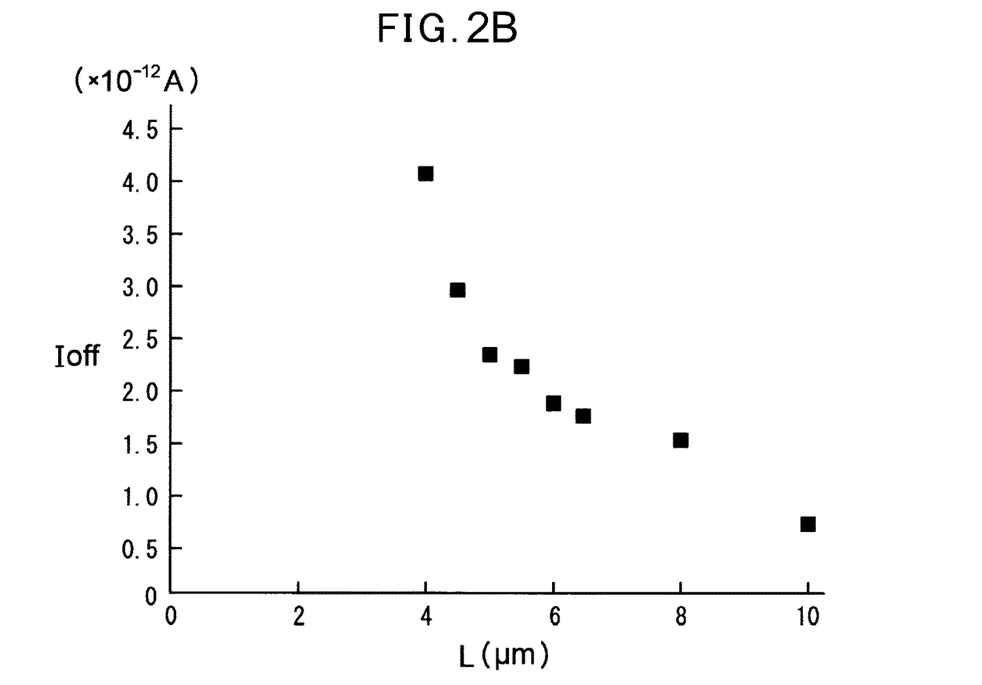
FIG. 2B shows a characteristic diagram of one example of the relationship between the channel length (L) of the thin film transistor and a drain current in Off state (Ioff).

In considering downsizing of the TFT, the inventor has studied effects of shortening of the channel length on the characteristics of the conventional TFT. Results of the study are shown in FIGS. 2A and 2B. FIG. 2A shows the relationship between a channel length L of the TFT and a gate threshold Vth, while FIG. 2B shows the relationship between the channel length L and a drain current in Off state Ioff. The TFT used for the study, the results of which are shown in FIG. 2A, has a channel width of 30 μm and a gate potential causing a drain current being greater than or equal to 10 pA is measured as the gate threshold Vth in a state where a 10V voltage is applied across the drain and the source. Moreover, for the study, the results of which are shown in FIG. 2B, the same TFT as that for the study in FIG. 2A is used, and a drain current is measured as the off current Ioff in a state where a 10V voltage is applied across the drain and the source and −5V voltage is applied to the gate electrode.

As shown in FIG. 2A, the gate threshold Vth decreases as the channel length L shortens. Moreover, as shown in FIG. 2B, the off current Ioff increases as the channel length L shortens. This is considered to be an effect of a so-called short channel effect, and the cause thereof is considered to be an occurrence of a punch-through phenomenon in which depletion layers of each of the source and the drain connect. However, to realize a high resolution of so-called 8K in a liquid crystal panel while having a good display characteristic (the aperture ratio of each pixel), for example, the gate length of less than or equal to 3 µm is considered to be required, so that, for the channel length L, a length being less than such a gate length is called for. On this point, extrapolating the gate threshold Vth and the off current Ioff at the channel length L of less than 3 µm based on FIGS. 2A and 2B, it is estimated to be difficult to obtain an ideal value of approximately 1V to 2V with respect to the gate threshold Vth, for example. The characteristic being practically suitable is expected be difficult to be obtained at the channel length L of less than 3 µm also with respect to the off current Ioff.

Figure 3A:
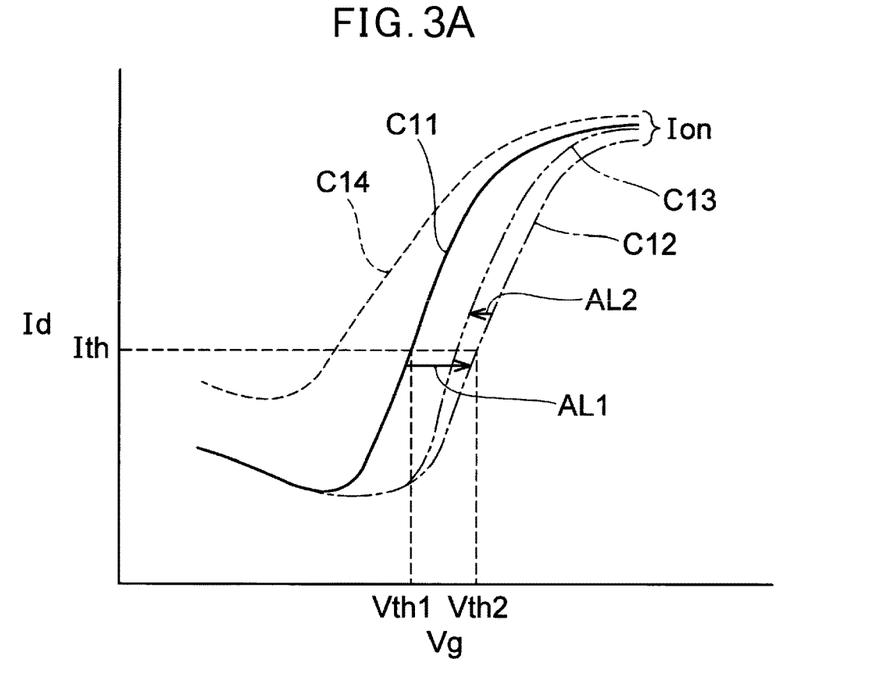
FIG. 3A shows a characteristic diagram to explain the function of the disclosure in the relationship between a gate potential (Vg) and a drain current (Id).
Figure 3B:
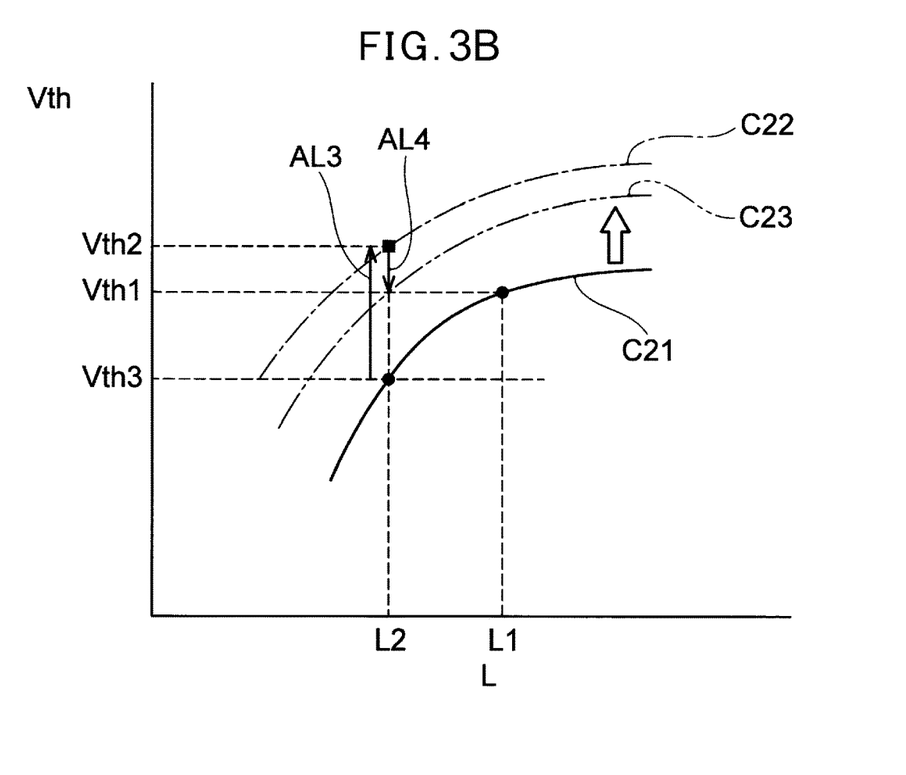
FIG. 3B shows a characteristic diagram to explain the function of the disclosure in the relationship between the channel length (L) and the gate threshold (Vth).

In a TFT having the characteristics of the gate threshold Vth and the off current Ioff (below both of these characteristics are also called switching characteristics collectively) as such, as described previously, the TFT 1 according to the embodiment comprises the gate electrode 2 having the laminated structure, and the low concentration impurities region 42 in the semiconductor layer 4 (see FIG. 1). With reference to FIGS. 3A and 3B, the function of the second layer 22 of the gate electrode 2 (see FIG. 1) and the low concentration impurities region (n− region) 42 is explained.

FIG. 3A conceptually shows the changes in the relationship between a gate potential Vg and a drain current Id caused by functions of the second layer 22 of the gate electrode 2 and the n− region 42. In FIG. 3A, a solid line C11 indicates a Vg-Id characteristic of a TFT having a specific gate length L1 (for example, 5 µm) and having the conventional structure, or, in other words, not comprising the second layer 22 and the n− region 42 of the TFT 1 according to the embodiment. This TFT has Vth1 as a gate threshold (a gate potential Vg causing a current Ith as the drain current Id). Shortening the gate length of this TFT to be less than L1 causes the characteristic shown in the solid line C11 to change to the characteristic shown in a broken line C14 due to the previously-described short channel effect. In other words, the gate threshold shifts in a direction being less than Vth1 and the off current (a drain current Id when the gate potential Vg is less than the gate threshold) increases.

Accordingly, in the TFT 1 according to the embodiment, the second layer 22 is provided at an interface between the gate electrode 2 being configured with mainly the first layer 21, and the gate insulating layer 3. In a case that the TFT 1 is an n-type field effect transistor, the second layer 22 is formed with a material having a work function (a second work function) being less than a work function (a first work function) of a material making up the first layer 21. Therefore, a hole, not an electron being a majority carrier, is induced in a large number at an interface between the gate insulating layer 3, and the semiconductor layer 4 being formed with amorphous silicon. Therefore, the gate threshold can be shifted in a direction toward the gate threshold being greater. On the other hand, in a case that the TFT 1 is a p-type field effect transistor, the second layer 22 is formed with a material having a second work function being greater than the first work function. Therefore, the electron, not the hole being a majority carrier is induced in a large number at the interface between the gate insulating layer 3, and the semiconductor layer 4 being formed with amorphous silicon. Therefore, the gate threshold can be shifted to a direction toward the gate threshold being greater.

It has been confirmed by a study by the inventor that the gate threshold increases by approximately 0.8V using aluminum, having a work function of approximately 4.2 eV, instead of copper having a work function of approximately 5.0 eV, as a material for the gate electrode. Therefore, in a case that the difference between the first work function and the second work function is δ (eV), the gate threshold is estimated to increase by approximately δ (eV). It is estimated that the gate threshold can be increased by approximately 1.5 V, compared to a case in which the gate electrode is formed with only copper, by combining copper (the first layer 21) and lanthanum (the second layer 22), the difference thereof in work function being approximately 1.5 eV as described previously, for example.

The function of the second layer 22 is shown with a chain line C12 in FIG. 3A. In other words, by providing the second layer 22, it is possible to shift the Vg-Id characteristic of the TFT having the conventional structure being shown with the solid line C11 in an increasing direction of the gate potential Vg (an orientation of an arrow AL1) and to increase the gate threshold from Vth1 to Vth2. Therefore, even decreasing the channel length in association with decreasing the gate length of the gate electrode 2, it is possible to also maintain the gate threshold to be greater than or approximately equal to the gate threshold Vth1 in the Vg-Id characteristic being shown with the solid line C11.

While the gate threshold increases in this way, a drain current (an on current) Ion in a region in which the gate potential Vg is sufficiently high (the state in which the TFT is being turned on) decreases in association with changes in the Vg-Id characteristic from the solid line C11 to the chain line C12. In the liquid crystal display panel having a high resolution such as 8K, for example, the time to charge an each pixel is less than that in the liquid crystal display panel having a low resolution, so that a decrease in the on current of the TFT being a pixel drive element is not preferable.

Accordingly, in the TFT 1 according to the embodiment, the low concentration impurities region (n− region) 42 is provided in the semiconductor layer 4 being formed with amorphous silicon. Providing the n− region 42 causes the carrier mobility in the semiconductor layer 4 to improve. As a result, as shown with a chain double-dashed line C13 in FIG. 3A, while the gate threshold decreases a little in a direction being shown with an arrow AL2, the on current Ion can be increased relative to the chain line C12. Therefore, the TFT 1 according to the embodiment makes it possible to maintain the gate threshold to greater than or approximately equal to Vth1 in the Vg-Id characteristic being indicated by the solid line C11 and makes it possible to suppress or prevent a decrease in the on current Ion, although shortening the channel length decreases the gate threshold as described previously.

The degree of an improvement in the on current and a decrease in the gate threshold by the n− region 42 can be controlled by the impurities concentration of the n− region 42.

With reference to FIG. 3B, the function of the second layer 22 of the gate electrode 2 and the n− region 42 is explained from a viewpoint of the relationship between the channel length L and the gate threshold Vth (L-Vth characteristic) shown in FIG. 2A previously referred to. In FIG. 3B, changes of the L-Vth characteristic caused by the function of the second layer 22 of the gate electrode 2 and the n− region 42 are conceptually shown. In FIG. 3B, a solid line C21 indicates the L-Vth characteristic of a TFT being the same as the TFT for which the Vg-Id characteristic is shown with the solid line C11 in FIG. 3A. In a manner similar to the study results in FIG. 2A, the gate threshold Vth decreases with shortening of the channel length L. For example, shortening the channel length L from L1 to L2 decreases the gate threshold from Vth1 to Vth3.

The second layer 22 is provided in the gate electrode 2 in the TFT 1 according to the embodiment, so that the L-Vth characteristic shown with the solid line C21 changes to a characteristic shown with a chain line C22. Therefore, the gate threshold at the channel length L2 can be increased to Vth2 as shown with an arrow AL3. Then, the n− region 42 is provided in the TFT 1 according to the embodiment, so that the L-Vth characteristic being shown with the chain line C22 changes to a characteristic being shown with a chain double-dashed line C23. Therefore, the gate threshold at the channel length L2 decreases as shown with an arrow AL4.

In the L-Vth characteristic being shown with the chain double-dashed line C23, the gate threshold Vth at the channel length L2 is the gate threshold Vth1 at the channel length L1 of the TFT having the conventional structure and shown with the solid line C21. In other words, a gate threshold being the same as that of the TFT having the conventional structure is obtained despite that the channel length L is shortened from L1 to L2. In this way, according to the embodiment, a decrease in the gate threshold caused by shortening of the channel length L can at least be suppressed while suppressing or preventing a decrease in the on current. In addition, a gate threshold. Vth being equivalent to that of the TFT having the conventional structure having a longer channel length L can also be obtained by appropriately selecting a material to be used for the second layer 22 of the gate electrode 2 and the concentration of the n− region 42 in accordance with a shortened amount of the channel length L.

As it can be understood from FIG. 3B, in a case that the channel length L is shortened to a desired length, L2, for example, the second layer 22 can be formed using a material having a work function by which the gate threshold Vth at L2 can be increased to Vth2 being higher than Vth1. In this way, a gate threshold being greater than or equal to Vth1 can be obtained at the channel length of L2 even after undergoing forming of the n− region 42, for example.

From the study results shown inn FIG. 2A previously referred to, the gate threshold is expected to sharply decrease when the channel length decreases below 4 μm. Therefore, it is preferable to sufficiently increase the gate threshold by providing the second layer 22. However, it is also desired that the gate threshold after shortening of the channel length do not diverge too much from the conventional gate threshold toward the greater side. For example, it can be preferable to increase the gate threshold by approximately 1.0 V to 2.0 V by providing the second layer 22. Therefore, in a case that the first layer 21 is formed using a material to be used for the gate electrode of the conventional TFT, the difference between the first work function and the second work function can be greater than or equal to 1.0 eV and less than or equal to 2.0 eV based on the relationship between the difference of the first work function and the second work function as previously described and changes in the gate threshold.

Even in a case that the gate electrode 2 is formed with only lanthanum having a work function being less than that of copper, the gate threshold is considered to be greater than that in a case that the gate electrode is formed with only copper. However, providing the first layer 21 being formed with copper, for example, and providing, only at the interface with the gate insulating layer 3, the second layer 22 comprising a material having a second work function, make it possible to configure the gate electrode 2 having a good conductivity at low cost.

According to the present embodiment, it is possible to shorten the channel length while suppressing deterioration in the switching characteristics in this way, therefore, it is possible to downsize a TFT while maintaining the appropriate characteristics. Moreover, as described below, providing a TFT 1 according to the present embodiment in an image display panel makes it possible to make a gate bus wiring thinner in association with shortening of the gate length as described previously. Furthermore, since the on current tends to increase with an effect by the n− region 42 and the effect caused by shortening of the channel length, it is possible to also decrease the channel width, or, in other words, the width of the source electrode and the drain electrode. As a result, in the same manner as the relationship between shortening of the width of a gate electrode and making the gate bus wiring thinner, making a source bus wiring thinner is also realized in association with shortening in the width of the source electrode. Therefore, by downsizing of the TFT and making each bus wiring thinner, it is possible to improve the aperture ratio of each pixel in the image display panel.

[Another Example of Thin Film Transistor]

Figure 4:
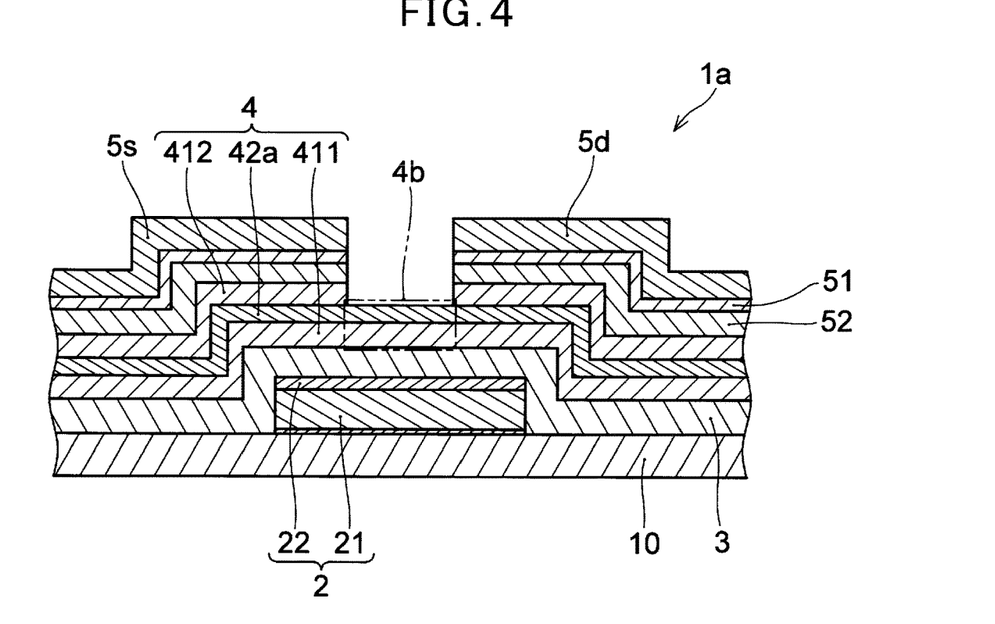
FIG. 4 shows a cross-sectional view of another example of the thin film transistor according to one embodiment of the disclosure.

In the TFT 1 exemplified in FIG. 1, the n− region 42 is included in the second region 4b. However, the n− region 42 can also be formed so as to extend also over a region, in the semiconductor layer 4 overlapping with each of the source electrode 5s and the drain electrode 5d in planar view. In FIG. 4a, another example according to the embodiment (a TFT 1a) in which an n− region 42a is provided to a region other than the second region 4b in this way is shown.

As shown in FIG. 4, in the TFT 1a, the n-region 42a is formed, not only in the second region 4b, but on the entire surface of the semiconductor layer 4 in planar view. In other words, the n-region 42a is formed also at a region of the semiconductor layer 4 overlapping with the source electrode 5s, and a region of the semiconductor layer 4 overlapping with the drain electrode 5d. However, also in the TFT 1a, the n− region 42a is separated from the gate insulating layer 3.

Moreover, the semiconductor layer 4 in the TFT 1a has the three-layer structure of a first intrinsic region 411 and a second intrinsic region 412, each of which is formed with non-doped amorphous silicon, and a low concentration impurities region (an n− region) 42a. The n− region 42a is arranged on the first intrinsic region 411, while the second intrinsic region 412 is arranged on the n− region 42a. The n− region 42a is sandwiched between the first intrinsic region 411 and the second intrinsic region 412. The first intrinsic region 411 is formed on the gate insulating layer 3, the n+ layer 52 and the contact layer 51 are formed on the second intrinsic layer 412, and each of the source electrode 5s and the drain electrode 5d is formed on the contact layer 51. Then, in the second region 4b, in the semiconductor layer 4, being sandwiched between the source electrode 5s and the drain electrode 5d in planar view, the second intrinsic region 412 is removed, causing the n− region 42a to be exposed.

The n− region 42a is formed such that it has the sheet resistance of greater than or equal to 20 kΩ/square when no voltage is applied to the gate electrode 2. Therefore, the TFT 1a can function as a switching element even when the n− region 42a is provided on the entire surface of the semiconductor layer 4 in planar view. Except for the n− region 42a and the first intrinsic region 411 and the second intrinsic region 412, the TFT 1a shown in FIG. 4 comprises constituting elements being the same as those of the TFT 1 shown in FIG. 1. The same reference numerals as that in FIG. 1 are affixed to FIG. 4 as needed to constituting elements being the same as those of the TFT 1 shown in FIG. 1, so that repeated explanations thereof will be omitted.

[Image Display Panel]

Next, an image display panel 100 comprising a thin film transistor (TFT) 1 according to one embodiment of the present disclosure is described with reference to FIG. 5. The image display panel 100 comprises the TFTs 1 being formed in a matrix on a substrate 6 and a plurality of pixels 7 being provided in a matrix on the substrate 6 to be driven using the TFTs 1. The image display panel 100 can comprise the TFTs 1a being another example of the one embodiment being shown in FIG. 4 instead of the TFTs 1.

The image display panel 100 further comprises a plurality of gate bus wirings 8a being arranged in parallel with each other in a column direction (Y direction in FIG. 5), each one of the plurality of gate bus wirings 8a extending in a row direction (X direction in FIG. 5) and a plurality of source bus wirings 8s being arranged in parallel with each other in the row direction, each one of the plurality of source bus wirings 8s extending in the column direction. The gate bus wiring 8g is connected to a gate driver 9g, and a gate signal to drive the TFT 1 is supplied from the gate driver 9g. The source bus wiring 8s is connected to a source driver 9s, and a source signal to be applied to the pixel 7 via the TFT 1 is supplied from the source driver 9s. In the example in FIG. 5, the gate driver 9g is formed on the image display panel 100, while the source driver 9s is provided at the exterior of the image display panel 100.

Figure 5:
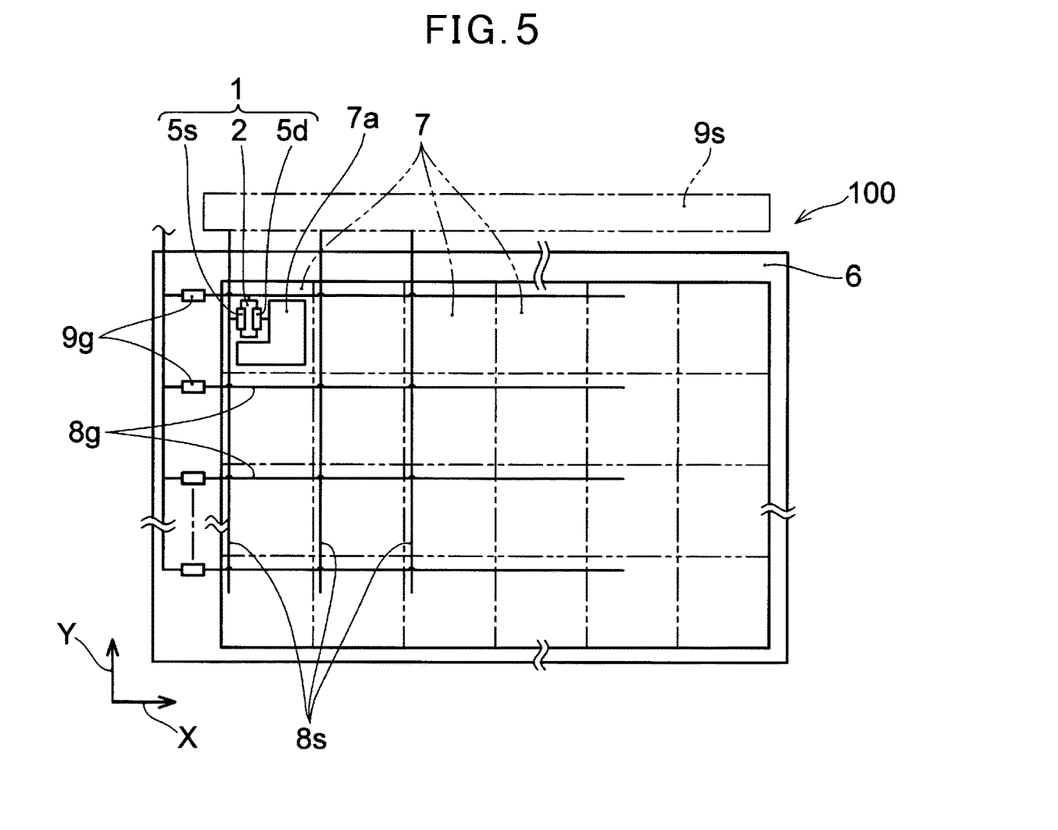
FIG. 5 schematically shows a view of one example of an image display panel comprising the thin film transistor according to one embodiment of the disclosure.

In the example n FIG. 5, the image display panel 100 is a liquid crystal display panel. The image display panel 100 is construed to be not particularly limited to the liquid crystal display panel as long as each one of the plurality of pixels being arranged in a matrix is driven by a thin film transistor, so that the image display panel 100 can be an organic-EL display panel, for example.

The TFT 1 comprises the gate electrode 2, and the source electrode 5s and the drain electrode 5d. While the TFT 1 comprises the semiconductor layer 4 and the gate insulating layer 3 as shown in FIG. 1, illustrations of these are omitted in FIG. 5. The gate electrode 2 is connected to the gate bus wiring 8g, the source electrode 5s is connected to the source bus wiring 8s, and the drain electrode 5d is connected to a pixel electrode 7a. The pixel electrode 7a faces a counter electrode (not shown) via a liquid crystal layer. A liquid crystal capacitance is formed by the pixel electrode 7a, the liquid crystal layer, and the counter electrode.

As the image display panel 100 comprises the TFT 1 (or can also be the TFT 1a) according to the one embodiment of the disclosure described previously, the channel length of the TFT 1 can be decreased while suppressing or preventing a decrease in the gate threshold. Therefore, in the image display panel 100, the TFT 1 being of a small size and having appropriate characteristics can be provided and, in association therewith, the gate bus wiring 8g and the source bus wiring 8s can be made thinner as described previously. In other words, the aperture ratio of each pixel 7 can be increased, making it possible to realize a high resolution display apparatus having appropriate display characteristics.

[Manufacturing Method for Thin Film Transistor]

Next, a manufacturing method for a thin film transistor (TFT) 1 according to one embodiment of the disclosure is described with reference to FIGS. 6A to 6H. As shown in FIGS. 6A to 6H, the manufacturing method for the TFT 1 comprises forming a gate electrode 2 on a substrate 10 consisting of glass substrate or insulating film; forming a gate insulating layer 3 to cover the gate electrode 2 therewith; and forming a semiconductor layer 4 on the gate insulating layer 3, the semiconductor layer 4 being a layer formed with amorphous silicon and comprising a first region 4a overlapping with the gate electrode 2 in planar view. The manufacturing method for the TFT 1 further comprises forming a source electrode 5s and a drain electrode 5d so as to face each other and have a predetermined interval above the first region 4a (in a direction being opposite to the gate electrode 2 with respect to the semiconductor layer 4) between the source electrode 5s and the drain electrode 5d; and providing a low concentration impurities region 42 containing impurities in a predetermined low concentration by adding the impurities to a predetermined region of the semiconductor layer 4, the predetermined region being separated from the gate insulating layer 3. Here, forming the gate electrode 2 comprises forming a first layer 21 using a material having a first work function; and forming a second layer 22 being interposed between the first layer 21 and the gate insulating layer 3 using a material having a second work function. In a case that an n-type field effect transistor is manufactured as the TFT 1, a material having the second work function being less than the first work function is used in forming the second layer 22. On the other hand, in a case that a p-type field effect transistor is manufactured as the TFT 1, a material having the second work function being greater than the first work function is used in forming the second layer 22.

Figure 6A:
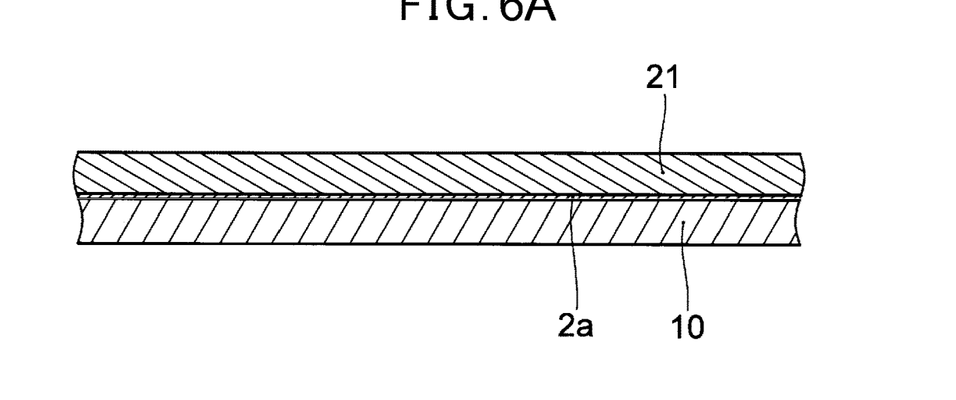
FIG. 6A shows a cross-sectional view of one example of a manufacturing method for a thin film transistor according to one embodiment of the disclosure.
Figure 6B:
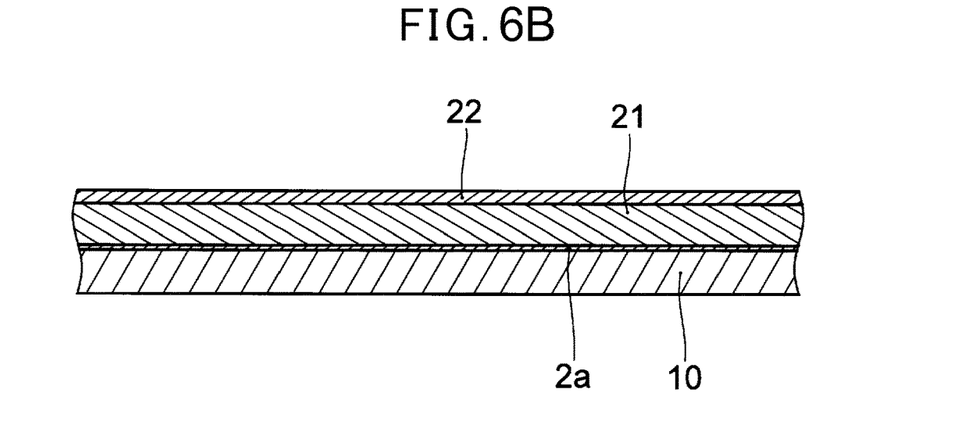
FIG. 6B shows a cross-sectional view of one example of the manufacturing method for the thin film transistor according to one embodiment of the disclosure.
Figure 6C:
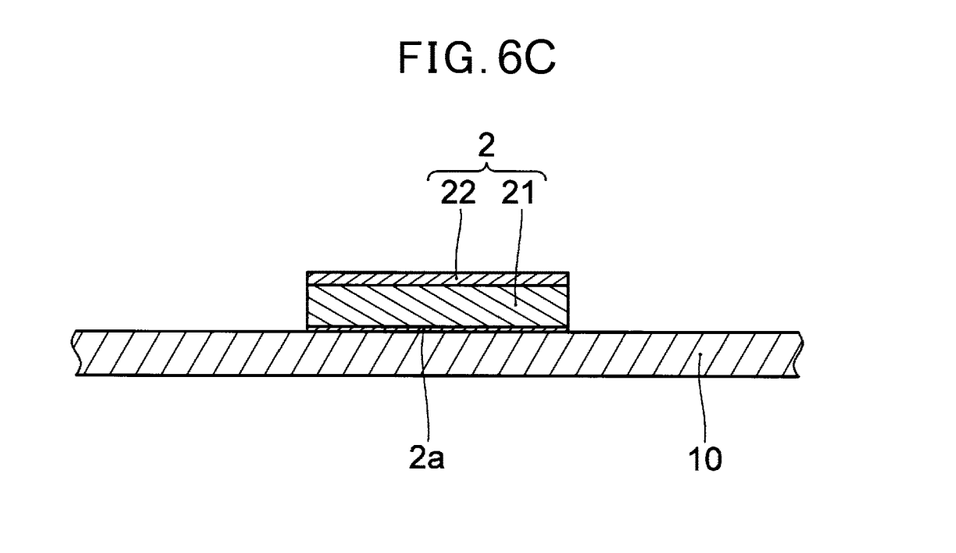
FIG. 6C shows a cross-sectional view of one example of the manufacturing method for the thin film transistor according to one embodiment of the disclosure.

First, as shown in FIGS. 6A to 6C, the gate electrode 2 is formed on the substrate 10. In the example in FIG. 6A, first a barrier metal 2a is formed on the substrate 10 and the first layer 21 making up the gate electrode 2 is formed on the barrier metal 2. The barrier metal 2a is formed using titanium or the like. The first layer 21 is formed using a material having a first work function being a predetermined work function, for example, copper, aluminum, or molybdenum. The barrier metal 2a and the first layer 21 are formed by sputtering, for example.

Then, as shown in FIG. 6B, the second layer 22 is formed on the first layer 21 using a material having a second work function being different from the first work function. The second layer 22 can also be formed by sputtering or the like. A material to be used to form the second layer 22 is selected in accordance with the type of impurities to be added to the semiconductor layer 4 in forming the low concentration impurities region 42 to be described below, or, in other words, the carrier type of the TFT 1. In a case that n-type impurities are to be added in forming the low concentration region 42, the second layer 22 is formed using a material having the second work function being less than the first work function, for example, various lanthanoids such as lanthanum. On the other hand, in a case that p-type impurities are to be added in forming the low concentration region 42, the second layer 22 is formed using a material having the second work function being greater than the first work function, for example, platinum, or a compound of a metal and selenium.

Then, as shown in FIG. 6C, a laminated metal layer comprising the first layer 21 and the second layer 22 is patterned by photolithography, for example, together with the barrier metal 2a, so that the gate electrode 2 having a desired shape is formed. While not shown, a gate bus wiring connecting to the gate electrode 2 is also integrally formed with the gate electrode 2. According to the manufacturing method for the thin film transistor of the present embodiment, the gate electrode 2 having the laminated structure is formed using two materials whose work functions are different from each other in this way, therefore, it is possible to increase the gate threshold relative to the TFT manufactured by the conventional manufacturing method.

Figure 6D:
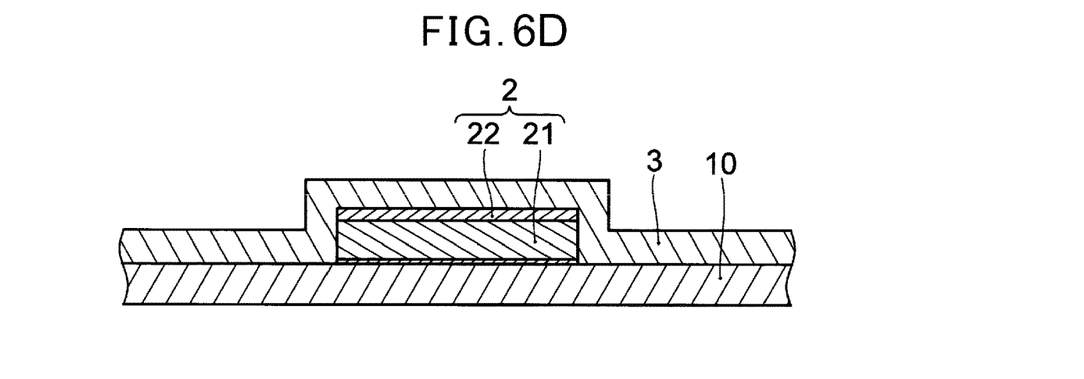
FIG. 6D shows a cross-sectional view of one example of the manufacturing method for the thin film transistor according to one embodiment of the disclosure.

Next, as shown in FIG. 6D, the gate insulating layer 3 is formed by forming a silicon oxide layer or a silicon nitride layer using CVD (Chemical Vapor Deposition), for example.

Figure 6E:
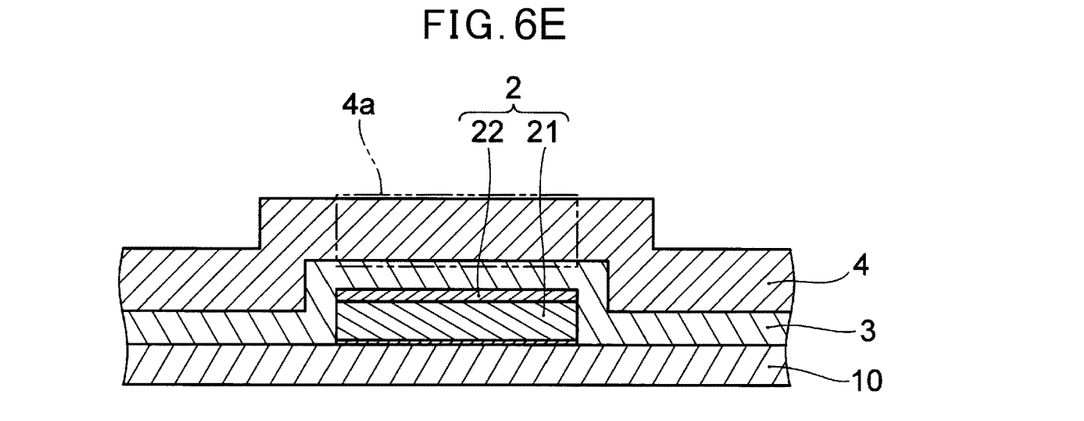
FIG. 6E shows a cross-sectional view of one example of the manufacturing method for the thin film transistor according to one embodiment of the disclosure.

Moreover, as shown in FIG. 6E, the semiconductor layer 4 is formed so as to comprise at least the first region 4a overlapping with the gate electrode 2 in planar view. The semiconductor layer 4 is formed by forming a semiconductor film being formed with amorphous silicon on the gate insulating layer 3 using CVD, for example.

Figure 6F:
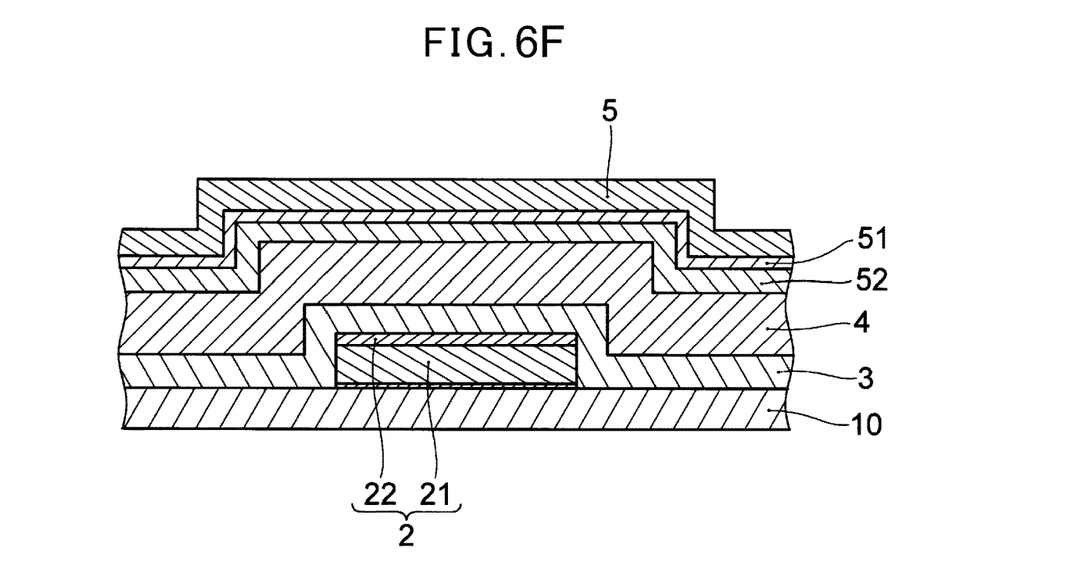
FIG. 6F shows a cross-sectional view of one example of the manufacturing method for the thin film transistor according to one embodiment of the disclosure.

Next, as shown in FIG. 6F, an impurities containing layer 52 having a predetermined thickness is formed by doping of impurities from the surface of the semiconductor layer 4. Moreover, a contact layer 51 is formed by doping of impurities. The impurities to be used in forming the impurities containing layer 52 and the contact layer 51 are n-type impurities such as phosphorus or arsenic in a case that an n-type field effect transistor is manufactured as the TFT 1, while the impurities are p-type impurities such as boron or indium in a case that a p-type field effect transistor is manufactured as the TFT 1. Next, using copper or molybdenum, a conductor layer 5 to be a source electrode and a drain electrode is formed on the contact layer 51 by sputtering, for example.

Figure 6G:
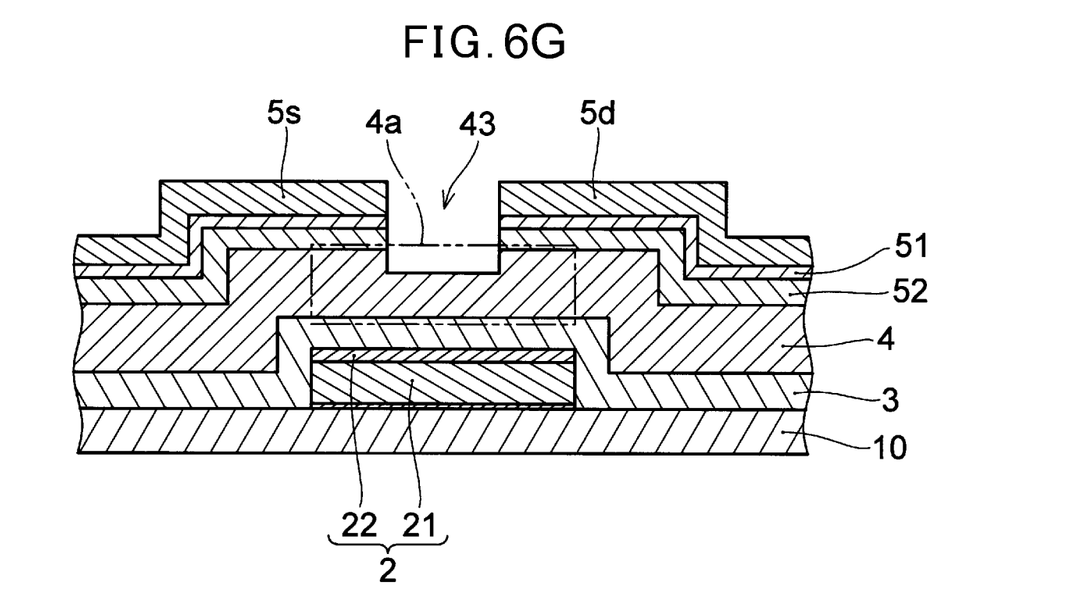
FIG. 6G shows a cross-sectional view of one example of the manufacturing method for the thin film transistor according to one embodiment of the disclosure.

Then, the conductor layer 5 is patterned using photolithography and, as shown in FIG. 6G, the source electrode 5s and the drain electrode 5d facing each other via the gate electrode 2 being sandwiched therebetween in planar view is formed. The source electrode 5s and the drain electrode 5d are formed so as to be mutually separated. Next, as shown in FIG. 6G, a part of the semiconductor layer 4 exposed between the source electrode 5s and the drain electrode 5d after patterning of the conductor layer 5 is removed by etching, for example, so that a recess 43 is formed.

Figure 6H:
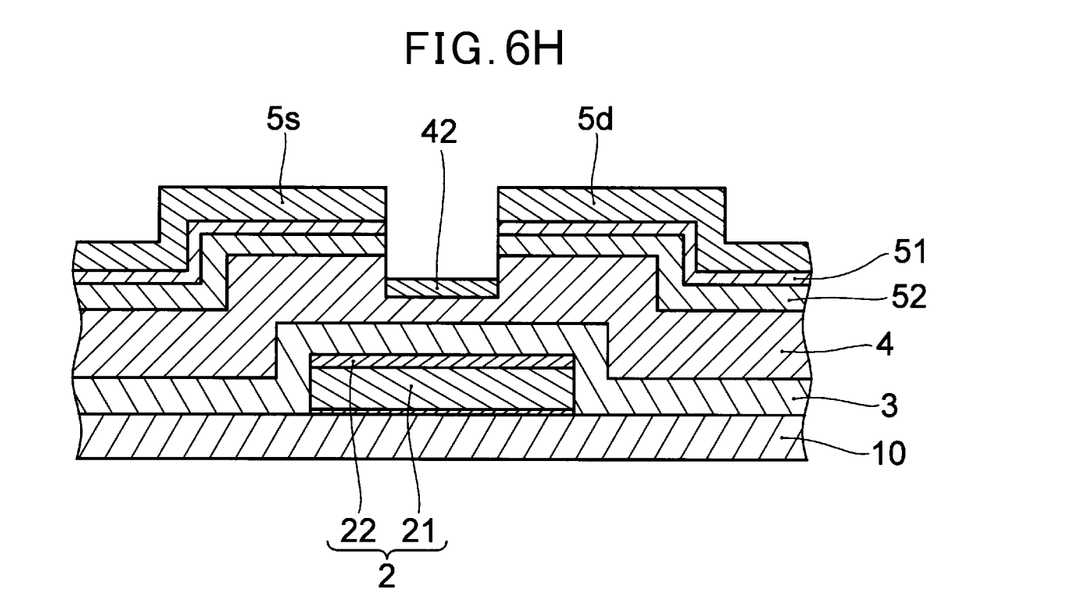
FIG. 6H shows a cross-sectional view of one example of the manufacturing method for the thin film transistor according to one embodiment of the disclosure.

Then, as shown in FIG. 6H, by adding impurities to a predetermined region of the semiconductor layer 4, the predetermined region being separated from the gate insulating layer 3, the low concentration impurities region 42 is formed in the predetermined region. In a case that an n-type field effect transistor is manufactured as the TFT 1, the low concentration impurities region (n– region) 42 is formed by adding n-type impurities such as phosphorus or arsenic, for example. On the other hand, in a case that a p-type field effect transistor is manufactured as the TFT 1, p-type impurities such as boron or indium, for example, is added to a predetermined region of the semiconductor layer 4. For example, conditions on adding the impurities are adjusted such that the impurities are contained in the low concentration impurities region 42 at a low concentration being approximately greater than or equal to $5E+16$ $(/cm^3)$ and less than or equal to $5E+18$ $(/cm^3)$. Moreover, the conditions on adding the impurities are adjusted such that the low concentration impurities region 42 and the gate insulating layer 3 are separated, or, in other words, the low concentration impurities region 42 does not reach the gate insulating layer 3.

For example, forming of the n– region 42 is carried out by, after forming the source electrode 5s and the drain electrode 5d, merely exposing the surface of the semiconductor layer 4 being exposed between the source electrode 5s and the drain electrode 5d to an atmosphere containing a predetermined element that can be impurities in the semiconductor layer 4. Forming of the n– region 42 can be carried out by merely storing the n-process TFT 1 having the exposed surface of the semiconductor layer 4 in an atmosphere containing a predetermined element.

In a case that the impurities are added with such a method, the n– region 42 having a concentration as previously exemplified can be formed by leaving the n-process TFT 1 for approximately 10 to 20 seconds in an atmosphere containing phosphine at approximately 200° C. to 350° C. The TFT 1 being exemplified in FIG. 1 is completed by undergoing the processes in the above. In a case that the TFT 1a in FIG. 4 is manufactured, the n-region 42a is formed after the process shown in FIG. 6E by adding the impurities. After a semiconductor layer, being formed with amorphous silicon, to be the second intrinsic region 412, is further formed, the impurities containing layer 52, etc., are successively formed.

[Conclusion]

(1) A thin film transistor according to one embodiment of the present disclosure comprises: a gate electrode; a semiconductor layer being formed using amorphous silicon and comprising a first region overlapping with the gate electrode in planar view; a gate insulating layer being interposed between the gate electrode and the semiconductor layer; and a source electrode and a drain electrode being arranged so as to face each other and have a predetermined interval above the first region between the source electrode and the drain electrode, wherein the gate electrode comprises a first layer having a first work function and a second layer having a second work function, the second layer being interposed between the first layer and the gate insulating layer; the semiconductor layer comprises an intrinsic region being formed with non-doped amorphous silicon; and a low concentration impurities region containing impurities in a predetermined low concentration and being formed in separation from the gate insulating layer; and the second work function is less than the first work function in a case that the impurities are n-type impurities, while the second work function is greater than the first work function in a case that the impurities are p-type impurities.

The configuration according to (1) makes it possible to realize downsizing of a thin film transistor (TFT) and, moreover, making a wiring being connected to the TFT thinner without causing variations in specific characteristics of the TFT.

(2) In the thin film transistor according to an aspect in (1) the above, the low concentration impurities region can be included in a second region of the semiconductor layer, the second region being sandwiched between the source electrode and the drain electrode in planar view. According to this aspect, an off current is unlikely to increase.

(3) In the thin film transistor according to an aspect of (2) in the above, the low concentration impurities region can be formed to a predetermined depth from a surface of the semiconductor layer, the surface being opposite to the gate insulating layer. This aspect can make it possible to obtain good switching characteristics.

(4) In the thin film transistor according to an aspect of (1) in the above, the semiconductor layer can have a three-layer structure comprising a first intrinsic region being arranged on the gate insulating layer; the low concentration impurities region being arranged on the first intrinsic region; and a second intrinsic region being arranged on the low concentration impurities region; and, in a second region of the semiconductor layer being sandwiched between the source electrode and the drain electrode in planar view, the second intrinsic region can be removed and the low concentration impurities region can be exposed. This aspect can make it possible to decrease an off current of a thin film transistor.

(5) In the thin film transistor according to an aspect of any one of (1) to (4) in the above, the difference between the first work function and the second work function can be greater than or equal to 1.0 eV and less than or equal to 2.0 eV. This aspect can make it possible to obtain an appropriate gate threshold in a case that the channel length is shortened.

(6) In the thin film transistor according to an aspect of any one of (1) to (5) in the above, the impurities can be the n-type impurities, the first layer can be formed using copper, and the second layer can comprise lanthanum. This aspect can make it possible to provide a gate electrode having a good conductivity in a small-sized TFT at low cost.

(7) The thin film transistor according to an aspect of any one of (1) to (6) in the above can further comprise, in between each of the source electrode and the drain electrode, and the semiconductor layer, a contact layer to make a contact with the source electrode or the drain electrode, and an impurities containing layer being formed with amorphous silicon containing impurities, wherein an impurities concentration of the low concentration impurities region can be less than an impurities concentration of the impurities containing layer.

(8) An image display panel according to another embodiment of the present disclosure comprises: a plurality of the thin film transistors, according to any one of (1) to (7) in the above, being formed in a matrix on a substrate; and a plurality of pixels being provided in a matrix on the substrate to be driven using the thin film transistors. The image display panel according to the present embodiment makes it possible to improve the aperture ratio of each pixel and increase the number of pixels without accompanying degradation in the display performance.

(9) A manufacturing method for a thin film transistor according to yet another embodiment of the present disclosure comprises: forming a gate electrode on a substrate; forming a gate insulating layer to cover the gate electrode; forming, on the gate insulating layer, a semiconductor layer being a layer formed with amorphous silicon and comprising a first region overlapping with the gate electrode in planar view; forming a source electrode and a drain electrode, by forming and patterning a conductor layer, so as to face each other and have a predetermined interval above the first region between the source electrode and the drain electrode; and providing a low concentration impurities region containing impurities in a predetermined low concentration at a predetermined region of the semiconductor layer by adding the impurities to the predetermined region, the predetermined region being separated from the gate insulating layer, wherein forming the gate electrode comprises: forming a first layer using a material having a first work function; and forming a second layer being interposed between the first layer and the gate insulating layer using a material having a second work function, and the second work function is less than the first work function in a case that the impurities are n-type impurities, while the second work function is greater than the first work function in a case that the impurities are p-type impurities.

(9) The configuration according to (9) makes it possible to realize downsizing of a thin film transistor (TFT) and, moreover, making a wiring being connected to the TFT thinner without causing variations in specific characteristics of the TFT.

(10) In the manufacturing method for the thin film transistor according to (9) in the above, providing the low concentration impurities region can comprise, after forming the source electrode and the drain electrode, exposing a surface of the semiconductor layer being exposed between the source electrode and the drain electrode to an atmosphere containing a predetermined element that can be impurities in the semiconductor layer. This aspect makes it possible to easily form a low concentration impurities layer only in a channel portion.

What is claimed is:

1. A thin film transistor comprising: a gate electrode; a semiconductor layer being formed using amorphous silicon and comprising a first region overlapping with the gate electrode in planar view; a gate insulating layer being interposed between the gate electrode and the semiconductor layer; and a source electrode and a drain electrode being arranged so as to face each other and have a predetermined interval above the first region between the source electrode and the drain electrode, wherein the gate electrode comprises a first layer having a first work function and a second layer having a second work function, the second layer being interposed between the first layer and the gate insulating layer; the semiconductor layer comprises an intrinsic region being formed with non-doped amorphous silicon; and a low concentration impurities region containing impurities of a predetermined low concentration and being formed in separation from the gate insulating layer; and the second work function is less than the first work function in a case that the impurities are n-type impurities, while the second work function is greater than the first work function in a case that the impurities are p-type impurities.

2. The thin film transistor according to claim 1, wherein the low concentration impurities region is included in a second region of the semiconductor layer, the second region being sandwiched between the source electrode and the drain electrode in planar view.

3. The thin film transistor according to claim 2, wherein the low concentration impurities region is formed to a predetermined depth from a surface of the semiconductor layer, the surface being opposite to the gate insulating layer.

4. The thin film transistor according to claim 1, wherein the semiconductor layer has a three-layer structure comprising a first intrinsic region being arranged on the gate insulating layer, the low concentration impurities region being arranged on the first intrinsic region, and a second intrinsic region being arranged on the low concentration impurities region.

5. The thin film transistor according to claim 1, wherein the difference between the first work function and the second work function is greater than or equal to 1.0 eV and less than or equal to 2.0 eV.

6. The thin film transistor according to claim 1, wherein the impurities are the n-type impurities, the first layer is formed using copper, and the second layer comprises lanthanum.

7. The thin film transistor according to claim 1, further comprising, in between each of the source electrode and the drain electrode, and the semiconductor layer, a contact layer to make a contact with the source electrode or the drain electrode, and an impurities containing layer being formed with amorphous silicon containing impurities, wherein an impurities concentration of the low concentration impurities region is less than an impurities concentration of the impurities containing layer.

8. An image display panel comprising:
- a plurality of the thin film transistors according to claim 1 being formed in a matrix on a substrate; and
- a plurality of pixels being provided in a matrix on the substrate to be driven using the thin film transistors.

9. A manufacturing method for a thin film transistor comprising: forming a gate electrode on a substrate; forming a gate insulating layer to cover the gate electrode; forming, on the gate insulating layer, a semiconductor layer being a layer formed with amorphous silicon and comprising a first region overlapping with the gate electrode in planar view; forming a source electrode and a drain electrode, by forming and patterning a conductor layer, so as to face each other and have a predetermined interval above the first region between the source electrode and the drain electrode; and providing a low concentration impurities region containing impurities of a predetermined low concentration at a predetermined region of the semiconductor layer by adding the impurities to the predetermined region, the predetermined region being separated from the gate insulating layer, wherein forming the gate electrode comprises: forming a first layer using a material having a first work function; and forming a second layer being interposed between the first layer and the gate insulating layer using a material having a second work function, and the second work function is less than the first work function in a case that the impurities are n-type impurities, while the second work function is greater than the first work function in a case that the impurities are p-type impurities.

10. The manufacturing method for a thin film transistor according to claim 9, wherein
- providing the low concentration impurities region comprises, after forming the source electrode and the drain electrode, exposing a surface of the semiconductor layer being exposed between the source electrode and the drain electrode to an atmosphere containing a predetermined element that can be impurities in the semiconductor layer.

* * * * *